US009246452B2

(12) United States Patent
Zhong et al.

(10) Patent No.: US 9,246,452 B2
(45) Date of Patent: Jan. 26, 2016

(54) EXTENDED VARIABLE GAIN AMPLIFICATION BANDWIDTH WITH HIGH-FREQUENCY BOOST

(71) Applicant: LSI Corporation, San Jose, CA (US)

(72) Inventors: Lizhi Zhong, Sunnyvale, CA (US); Freeman Y. Zhong, San Ramon, CA (US); Hiroshi Kimura, San Jose, CA (US); Eric W. Zhang, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/780,123

(22) Filed: Feb. 28, 2013

(65) Prior Publication Data

US 2014/0225669 A1 Aug. 14, 2014

Related U.S. Application Data

(60) Provisional application No. 61/764,193, filed on Feb. 13, 2013.

(51) Int. Cl.
*H04L 27/08* (2006.01)
*H03F 3/45* (2006.01)
*H03G 1/00* (2006.01)

(52) U.S. Cl.
CPC ......... *H03F 3/45197* (2013.01); *H03G 1/0029* (2013.01); *H03F 2203/45488* (2013.01); *H03F 2203/45494* (2013.01)

(58) Field of Classification Search
CPC .................. H04L 25/03057; H04L 25/03038; H04L 25/03019; H04L 25/03133; H04L 25/03343; H04L 27/2647; H04L 27/2657; H04L 2027/003; H04L 5/0007; H04B 3/32
USPC .................. 375/229–233, 260, 285, 344–345
See application file for complete search history.

(56) References Cited

U.S. PATENT DOCUMENTS

| 5,237,463 | A | * | 8/1993 | Cronch et al. .................. 360/46 |
| 6,862,152 | B2 | | 3/2005 | Wu et al. .......................... 360/65 |
| 7,421,046 | B2 | * | 9/2008 | Wallace et al. ................ 375/347 |
| 7,778,323 | B1 | | 8/2010 | Nodenot et al. ............... 375/233 |
| 2004/0013188 | A1 | * | 1/2004 | Tonietto et al. ............... 375/229 |
| 2004/0081146 | A1 | | 4/2004 | Tang et al. ..................... 370/370 |
| 2004/0212437 | A1 | * | 10/2004 | Kim ...................... H03F 1/0277 330/295 |
| 2004/0229586 | A1 | * | 11/2004 | Oshima et al. ............. 455/240.1 |
| 2005/0258896 | A1 | * | 11/2005 | Bardsley ............... H03F 1/0277 330/51 |
| 2006/0045176 | A1 | * | 3/2006 | Moughabghab et al. ...... 375/232 |
| 2006/0088089 | A1 | | 4/2006 | Gondi et al. ................... 375/232 |
| 2007/0111691 | A1 | * | 5/2007 | Hanke ..................... H04B 1/005 455/239.1 |
| 2007/0147557 | A1 | * | 6/2007 | Demoulin et al. ............. 375/345 |
| 2008/0069191 | A1 | | 3/2008 | Dong et al. .................... 375/219 |
| 2009/0207311 | A1 | * | 8/2009 | Fu et al. ......................... 348/678 |
| 2009/0261899 | A1 | * | 10/2009 | Gomez et al. ..................... 330/2 |
| 2010/0141340 | A1 | * | 6/2010 | Huang et al. .................. 330/253 |
| 2010/0142606 | A1 | * | 6/2010 | Kato ............................... 375/232 |
| 2011/0103459 | A1 | * | 5/2011 | Esmailian et al. ............. 375/233 |
| 2011/0169574 | A1 | * | 7/2011 | Bi .................................. 330/304 |

* cited by examiner

*Primary Examiner* — Dac Ha
*Assistant Examiner* — Janice Tieu

(57) ABSTRACT

An apparatus having a circuit is disclosed. The circuit may be configured to (i) receive an input signal from a communication channel and (ii) generate an intermediate signal by amplifying the input signal (a) by a low-frequency gain in response to an amplitude control signal and (b) by a high-frequency gain in response to a boost control signal.

20 Claims, 6 Drawing Sheets

EXTENDED VARIABLE GAIN AMPLIFICATION BANDWIDTH WITH HIGH-FREQUENCY BOOST

The present application is related to co-pending U.S. application Ser. No. 13/604,812, filed Sep. 6, 2012, and is hereby incorporated by reference in its entirety.

FIELD OF THE INVENTION

The present invention relates to variable gain amplifiers generally and, more particularly, to a method and/or apparatus for implementing an extended variable gain amplification bandwidth with high-frequency boost.

BACKGROUND OF THE INVENTION

Specified bandwidths of variable gain amplifiers (i.e., VGA) in serial bus applications are getting wider as data rates increase. For example, at 28 gigabits per second the bandwidth of the VGA is commonly specified to be at least 75% of a maximum data rate, which means a 21 gigahertz bandwidth. The wider bandwidths are challenging, especially when the VGA gain is high. A gain-bandwidth-product limit of semiconductor processes makes circuit implementation of the VGAs difficult. Traditional VGA designs aim to make the VGA gain as flat as possible within the specified bandwidth region. The VGAs should provide a flat gain across the entire spectrum, so in effect a received signal is scaled by a prescribed amount. In practice, the VGA bandwidth reduces as the gain increases due to the gain-bandwidth-product limit. As a result, the bandwidth of a conventional VGA is smallest at the highest gain setting.

Referring to FIG. 1, a diagram illustrating a normalized graph of a conventional unequalized channel pulse response 10 is shown. A single impulse generated by a transmitter has a normalized duration of a unit interval (i.e., 1 UI) or symbol interval, with a time zero corresponding to a current cursor 16. Samples 12-14 correspond to an inter-symbol interference (i.e., ISI) to future symbols and are called precursor ISI. Samples 18-20 correspond to the ISI of past symbols and are called postcursor ISI.

It would be desirable to implement an extended variable gain amplification bandwidth with high-frequency boost.

SUMMARY OF THE INVENTION

The present invention concerns an apparatus having a circuit. The circuit may be configured to (i) receive an input signal from a communication channel and (ii) generate an intermediate signal by amplifying the input signal (a) by a low-frequency gain in response to an amplitude control signal and (b) by a high-frequency gain in response to a boost control signal.

The features and advantages of the present invention include providing an extended variable gain amplification bandwidth with high-frequency boost that may (i) use the high-frequency boost to compensate for a loss of bandwidth at higher frequencies, (ii) extend an effective bandwidth, (iii) help equalize signals passing through a communication channel, (iv) use a higher boost when the gain is higher, (v) use a lower boost or no boost when the gain is lower and/or (vi) be implemented in an integrated circuit.

BRIEF DESCRIPTION OF THE DRAWINGS

These and other features and advantages of the present invention will be apparent from the following detailed description and the appended claims and drawings in which:

DETAILED DESCRIPTION OF THE PREFERRED EMBODIMENTS

Bandwidth is typically defined as a frequency point where a gain is three decibels (e.g., dB) less than a gain at DC. Communication channels generally behave as low pass filters, which attenuate signals more at higher frequencies, and so have a finite bandwidth. Therefore, equalization is generally used to compensate the signals at the attenuated frequencies. Some embodiments of the present invention may extend the bandwidth of a combination of a communication channel and a variable gain amplifier (e.g., VGA) by intentionally making the VGA gain non-flat. An amplification boost may be applied by the VGA at the higher frequencies of an appropriate amount such that the overall gain of the combination remains relatively flat within the new bandwidth. By looking at the effect of the communication channel and the VGA together, having a high-frequency VGA gain greater than the DC gain is generally advantageous. The extra gain may be used to compensate for the attenuation of the signals at the higher frequencies.

The high-frequency boost may be programmable. When the DC gain is low, the high-frequency gain may be programmed lower to prevent over equalization automatically. When the DC gain is increased, the high-frequency gain may be programmed higher to provide equalization automatically and extend the combined bandwidth.

Figure 2:
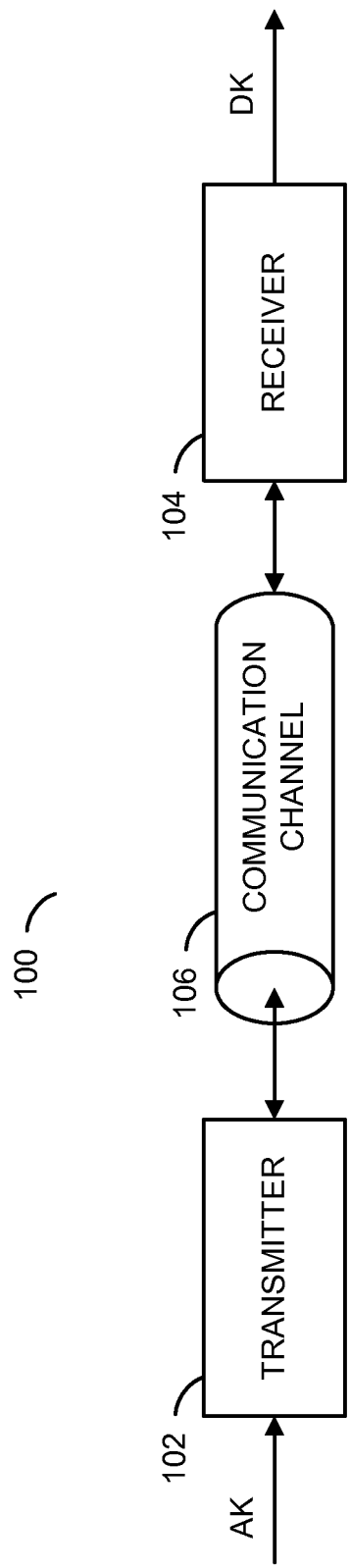
FIG. 2 is a block diagram of illustrating a communication system having an extended variable gain amplification bandwidth with high-frequency boost.

Referring to FIG. 2, a block diagram is shown illustrating a communication system 100 having an extended variable gain amplification bandwidth with high-frequency boost. The system 100 may be implemented as multiple circuits or devices and/or on (in) multiple integrated circuits. The system 100 may include a block (or circuit) 102, a block (or circuit) 104 and a block (or circuit) 106. The system 100 may implement a serializer-deserializer (e.g., SerDes) apparatus. In a SerDes apparatus (or system), parallel data may be serialized in a transmitter (e.g., circuit 102), transferred as serial data on a communication channel (e.g., circuit 106) and subsequently deserialized in a receiver (e.g., circuit 104) back into the parallel data. The circuits 102-106 may represent modules and/or blocks that may be implemented as hardware, software, a combination of hardware and software, or other implementations. A signal (e.g., AK) may be received by the circuit 102. The signal AK may implement a data signal. A signal (e.g., DK) may be generated by the circuit 104. The signal DK may carry recovered data.

The circuit 102 may implement a transmitter circuit. The circuit 102 is generally operational to generate signals carrying data to be communicated to the circuit 104. In some configurations, the circuit 102 may also be operational to receive signals carrying data received from the circuit 104. The signals maybe communicated between the circuit 102 and the circuit 104 via the circuit 106. The circuit 102 may be fabricated as one or more integrated circuits (or chips or die). The circuit 106 may be fabricated as one or more of traces, wires, transmission lines, optical fiber and/or wireless media. The circuit 104 may be fabricated as one or more integrated circuits (or chips or die).

The circuit 102 may participate in some configurations to apply a high-frequency boost to extend the overall bandwidth of the system 100. The circuit 102 may include a programmable VGA that boosts the high-frequency signals before attenuation by the circuit 106 and subsequent equalization in the circuit 104.

The circuit 104 may implement a receiver circuit. The circuit 104 is generally operational to receive signals from the circuit 102 via the circuit 106. In some cases, the circuit 104 may also be operational to send signals to the circuit 102 via the circuit 106. The circuit 104 may provide the high-frequency boost in a VGA to extend the overall bandwidth of the system 100. The circuit 104 may be configured to (i) receive an input signal from the circuit 106, (ii) generate an intermediate signal by amplifying the input signal (a) by a low-frequency gain in response to an amplitude control signal and (b) by a high-frequency gain in response to a boost control signal and (iii) generate the recovered signal DK.

The high-frequency gain may variably extend the bandwidth of the intermediate signal based on the boost control signal. The high-frequency gain may be boosted to reduce an attenuation of the circuit 106 to help equalize the communication channel. At low program gains, the high-frequency gain generally matches a low-frequency gain. The high-frequency gain may be adjusted to reduce over equalization with the amplification being programmable to one of multiple gain codes at a time.

The circuit 104 may also be configured to linear equalize the input signal before or after the VGA. In some embodiments, the amplification may be performed by linear equalizing the input signal by an initial stage amplification (e.g., the VGA) before a feed forward equalization. The feed forward equalization may cause an amplitude reduction of a main cursor in the input signal. Therefore, the circuit 104 may also compensate for the amplitude reduction by a subsequent stage amplification (e.g., another VGA) after the feed forward equalization.

Figure 1:
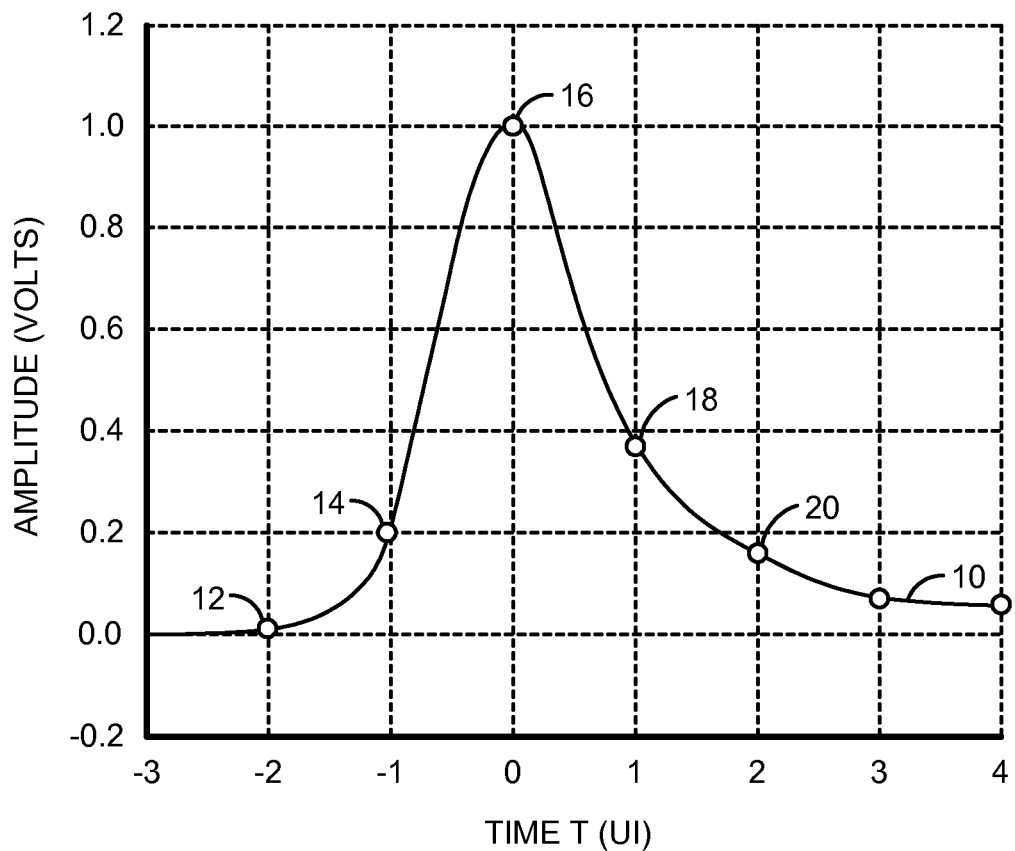
FIG. 1 is a diagram illustrating a normalized graph of a conventional unequalized channel pulse response.

The circuit 106 may implement a communication channel. The channel 106 is generally operational to carry the data communicated from the circuit 102 to the circuit 104. The channel 106 may also carry data communicated from the circuit 104 to the circuit 102. The characteristics of the channel 106 generally cause distortions in amplitude and/or phase of the data signals as the data signals propagate from one port of the channel 106 to the other port, see FIG. 1. The channel characteristics may also change over time and/or temperature. Implementations of the channel 106 may include, but are not limited to, one or more transmission medium such as air, wire, transmission line, optical fibre, Ethernet and the like.

Figure 3:
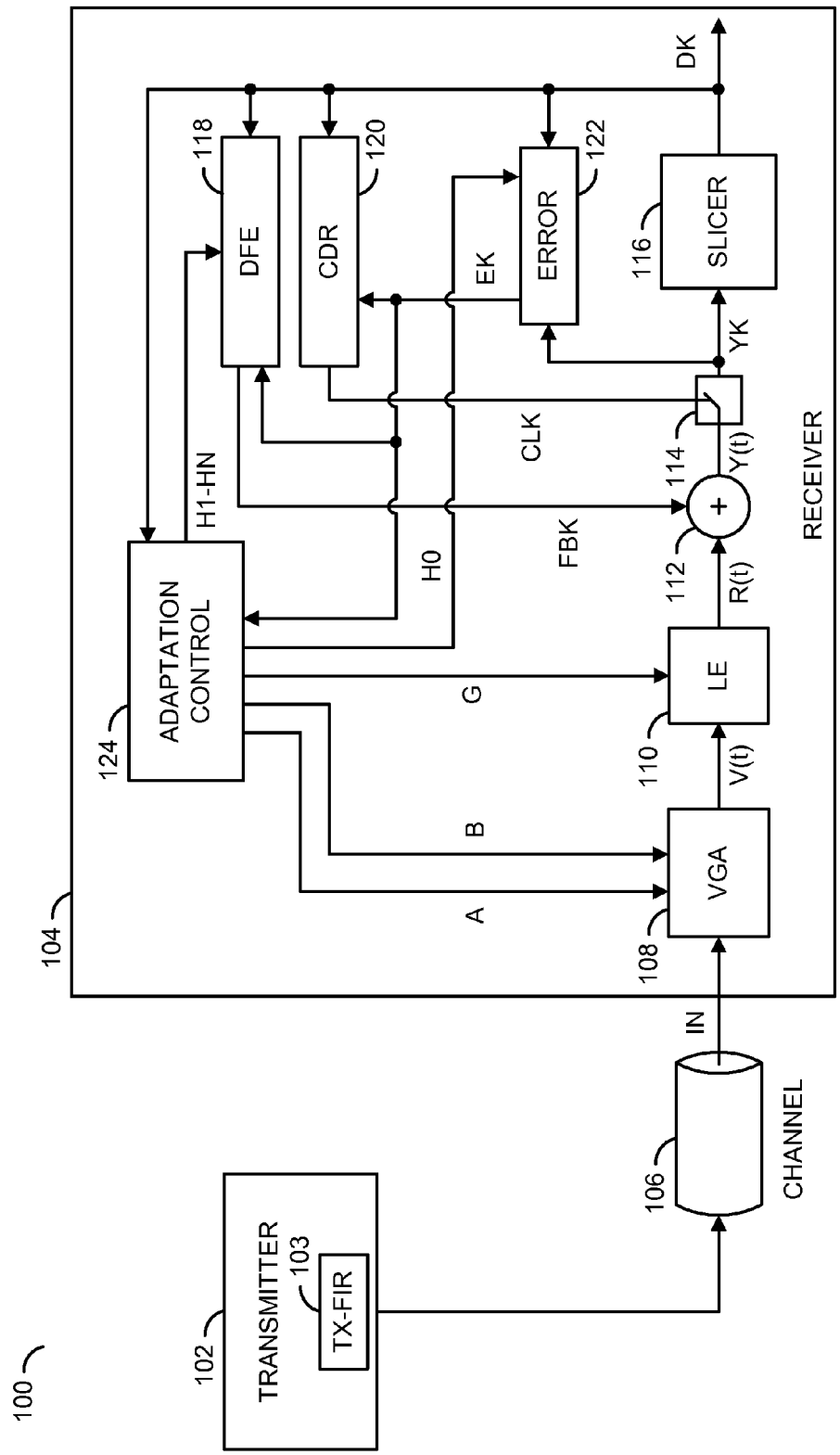
FIG. 3 is a detailed block diagram illustrating the system in accordance with an embodiment of the present invention.

Referring to FIG. 3, a detailed block diagram illustrating the system 100 is shown in accordance with an embodiment of the present invention. In some embodiments, the circuit 102 may include a block (or circuit) 103. The circuit 103 may implement a transmitter finite impulse response (e.g., TX-FIR) filter and/or a variable gain amplifier. The circuit 104 may comprise a block (or circuit) 108, a block (or circuit) 110, a block (or circuit) 112, a block (or circuit) 114, a block (or circuit) 116, a block (or circuit) 118, a block (or circuit) 120, a block (or circuit) 122, and a block (or circuit) 124. The circuits 103 and 108 to 124 may represent circuits and/or blocks that may be implemented as hardware, software, a combination of hardware and software, or other implementations.

The circuit 108 may be implemented as a variable gain amplifier having a programmable gain amplitude and high-frequency boost. The circuit 110 may be implemented as a linear equalizer (e.g., LE). The circuit 112 may be implemented as an adder. The circuit 114 may be implemented, for example, as an analog-to-digital converter. The circuit 116 may be implemented as a detector. As an example, the circuit 116 may be implemented as a slicer. However, other types of detectors (e.g., symbol detector, bit slicer, etc.) may be implemented accordingly to meet the design criteria of a particular implementation. The circuit 118 may be implemented as an adaptive decision feedback equalizer (e.g., DFE). The circuit 120 may be implemented as a baud-rate clock and data recovery (e.g., CDR) module. The circuit 122 may be implemented as an error signal generation module. The circuit 124 may be implemented as an adaptation control logic module.

The circuit 108 may have an input that may receive a signal (e.g., IN) from the channel 106, an input that may receive a signal (e.g., A) from the circuit 124 and another signal to receive a signal (e.g., B) from the circuit 124. In one example, the signal IN may be converted from an optical signal to an electrical signal before presentation to the input of the circuit 108. The signal A may be implemented as an amplification control signal. The signal A may convey a control value for a variable amount of gain to the circuit 108. The signal B may implement a boost control signal. The signal B may convey a program value that determines the high-frequency boost provided by the circuit 108. The circuit 108 may generate an intermediate signal (e.g., V(t)) as an amplified version of the signal IN.

The circuit 110 generally has an input that receives the signal V(t) from the circuit 108 and another input that may receive a signal (e.g., G) from the circuit 124. The signal G may control a gain and/or poles of the circuit 110. The circuit 110 may have an output that presents an equalized signal (e.g., R(t)) to the circuit 112. The signal R(t) may comprise an equalized version of the intermediate signal V(t).

The circuit 112 may have an input to receive the signal R(t) and another input to receive a feedback signal (e.g., FBK) from the circuit 118. An output of the circuit 112 may present a signal (e.g., Y(t)) to an input of the circuit 114. The signal Y(t) may comprise a sum of the equalized signal R(t) and the signal FBK.

The circuit 114 may have an input to receive the signal Y(t) and another input to receive a clock signal (e.g., CLK). An output of the circuit 114 may present samples (e.g., YK) of the signal Y(t) to an input of the circuit 116 and an input of the circuit 122. The circuit 114 may sample the signal Y(t) in response to the signal CLK. The signal CLK may be received by the circuit 114 from an output of the circuit 120. An output of the circuit 116 may present the data output signal DK.

The signal DK may be presented to an input of the circuit 118, an input of the circuit 120, an input of the circuit 122 and an input of the circuit 124. An output of the circuit 122 may present a signal (e.g., EK) to another input of the circuit 118, another input of the circuit 120 and another input of the circuit 124. The signal EK may be generated in response to the signal YK, the signal DK, and a signal (e.g., H0). The signal H0 may be received by the circuit 122 from an output of the circuit 124. Another output of the circuit 124 may present a signal comprising a number of tap weights (e.g., H1-HN) to an input of the circuit 118. An output of the circuit 124 may present a signal G to the circuit 110. Other outputs of the circuit 124 may present the signal A and the signal B to the circuit 108.

The signal EK may comprise an error signal. The signal H0 may comprise a target signal amplitude. The target signal amplitude H0 generally represents a desired signal amplitude (e.g., EK=H0*DK−YK). After error is minimized, YK is generally close to the desired signal: H0*DK. The module 124 may be configured to generate one or more control signals that my be used to control activation and scheduling of equalizer adaptation loops of the circuit 108, the circuit 110 and the circuit 118.

The equalizer adaptation loops may be implemented using conventional techniques modified to allow equalization control. In one example, the circuit 118 may be implemented as a fixed tap (e.g., 8-10 taps) DFE. In another example, the circuit 118 may be implemented as a floating tap DFE. The floating tap DFE generally provides effective cancellation of reflections in the channel 106.

The signals presented by the circuit 124 to the circuit 118 may be implemented in a variety of ways. The expression Hi*Dk−i may be used generally to represent the taps of the DFE circuit 118, where i represents the tap position. For example, an initial tap of the circuit 118 may be expressed as H1*DK−1. The tap position of the initial tap is 1 and H1 is the tap weight of the tap at tap position 1. The tap weight H1 may have a value (e.g., h1). For h1=20 mV, 20 mV is the tap weight value of the tap at tap position 1. If 20 mV corresponds to a code, for example, of 5 in a particular implementation, 5 is the code of the tap weight of the tap at tap position 1. In an example, the signals presented by the circuit 124 may comprise tap weight values. In another example, the signals presented by the circuit 124 to the circuit 118 may comprise codes of the tap weights (e.g., codes corresponding to the tap weight values).

Figure 4:
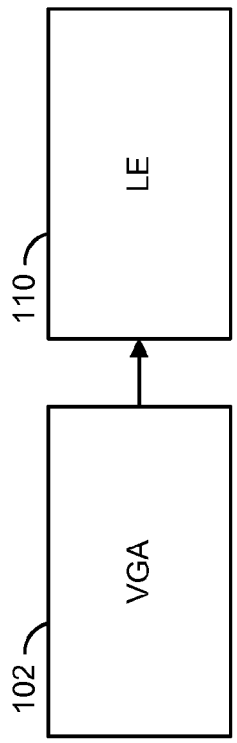
FIG. 4 is a diagram of an example arrangement of a variable gain amplifier and a linear equalizer.

Referring to FIG. 4, a diagram of an example arrangement of the variable gain amplifier and the linear equalizer is shown. In some embodiments, the VGA circuit may be positioned within the circuit 104, as shown in FIG. 3. In other embodiments, the VGA circuit may be located in the circuit 102, as shown in FIG. 4. In such embodiments, the signal V(t) may be transferred from the circuit 102 to the circuit 104 via the channel 106. The signals A and B may be transferred from the circuit 104 through the channel 106 to the VGA circuit within the circuit 102 to control the VGA amplitude and boost.

Figure 5:
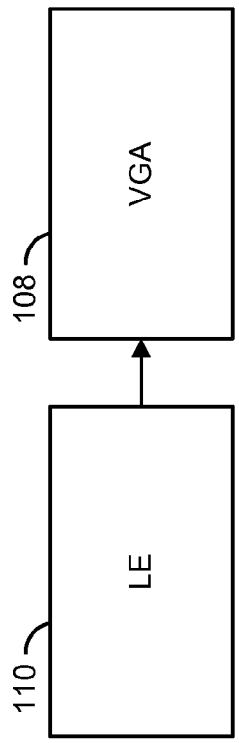
FIG. 5 is a diagram of another example arrangement of the variable gain amplifier and the linear equalizer.

Referring to FIG. 5, a diagram of another example arrangement of the variable gain amplifier and the linear equalizer is shown. In some embodiments, the circuits 108 and 110 may be swapped such that the circuit 110 feeds into the circuit 108. In such configurations, the circuit 110 may receive the signal IN. The signal IN may be subsequently equalized and transferred to the circuit 108. The circuit 108 may amplify the equalized signal and apply the high-frequency boost. The resulting signal may be presented to the circuit 112 to add in the feedback signal FBK.

Figure 6:
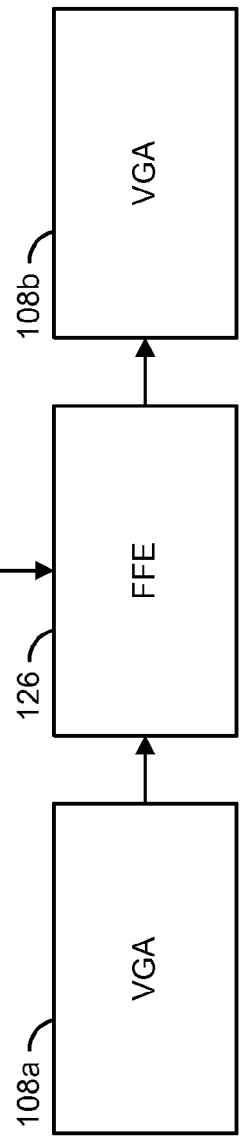
FIG. 6 is a partial diagram of an example implementation of a receiver circuit of the system.

Referring to FIG. 6, a partial diagram of an example implementation of the circuit 104 is shown. In some embodiments, the circuit 104 may include a block (or circuit) 126. The circuit 108 may be divided into a two-stage pair of circuits 108a-108b. The circuits 108a-108b and 126 may represent circuits and/or blocks that may be implemented as hardware, software, a combination of hardware and software, or other implementations.

Each circuit 108a-108b may implement a stage of the variable gain amplifier. The circuit 108a may have the input to receive the signal IN. The circuit 108b may have the output to present the signal V(t). An output of the circuit 108a may present a signal to the circuit 126. An output of the circuit 126 may present a signal received by the circuit 108b. The circuit 108a may be designed to provide a linear response into the circuit 126. The circuit 108b may compensate for a reduction of the main cursor 16 amplitude due to the circuit 126.

The circuit 126 may be implemented as a feed forward equalizer (e.g., FFE). The circuit 126 is generally operational to compensate for a channel pulse response (e.g., fn) of the channel 106. The channel pulse response fn may be estimated using the DFE tap weights with the FFE circuit 126 turned off to avoid interference to the DFE circuit 118. Once the channel pulse response fn is estimated, the estimate may be used by the FFE circuit 126. The DFE adaptation may be reset to allow the DFE circuit 118 to adapt at the same time (using the same loop filter bandwidth) as the circuit 126 to achieve a joint solution. For example, a signal comprising multiple tap weights (e.g., C1-CM) may be presented by the circuit 124 to the circuit 126. The tap weights C1-CM may be generated based upon the estimate of the channel pulse response. Additional details of the channel pulse response estimation may be found in co-pending U.S. application Ser. No. 13/604,812, which is hereby incorporated by reference in its entirety.

Figure 7:
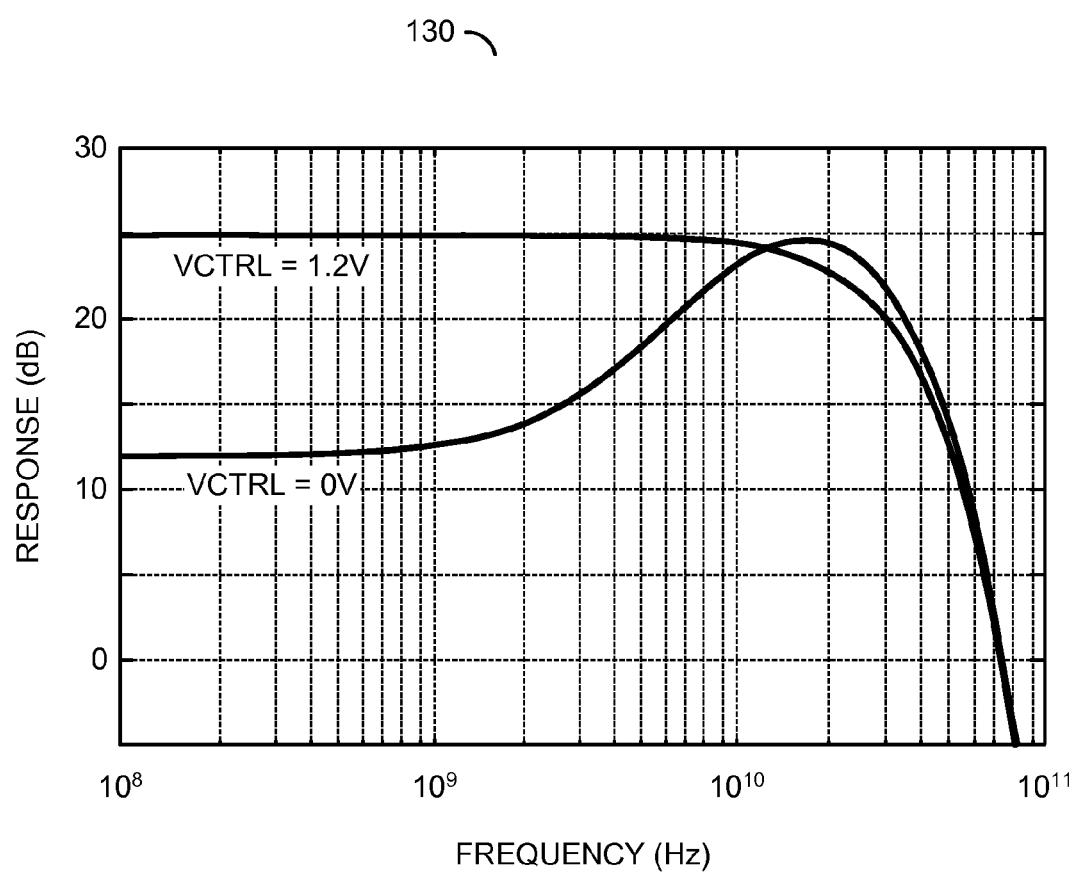
FIG. 7 is a graph of example frequency responses of a combination of a communication channel and the variable gain amplifier.

Referring to FIG. 7, a graph 130 of example frequency responses of a combination of the channel 106 and the VGA circuit 108 is shown. At a low control value (e.g., VCTRL=0 volts) in the signal A, the circuit 108 may provide a small or no high-frequency boost that results in a nonlinear high-frequency response over a given range (e.g., in an approximately 1 to 20 gigahertz (GHz) range). The 3 dB bandwidth in the example may be wide (e.g., 60 GHz). At a high control value (e.g., VCTRL=1.2 volts) in the signal A, the circuit 108 may provide a high-frequency boost to maintain the wide (e.g., 60 GHz) bandwidth with an increased amplification and an approximately linear frequency response. A combination of the high-frequency boost of the circuit 108 and the low-frequency characteristics of the channel 106 may result in a reasonably flat frequency response over most of the bandwidth (e.g., from DC to 10 GHz).

Figure 8:
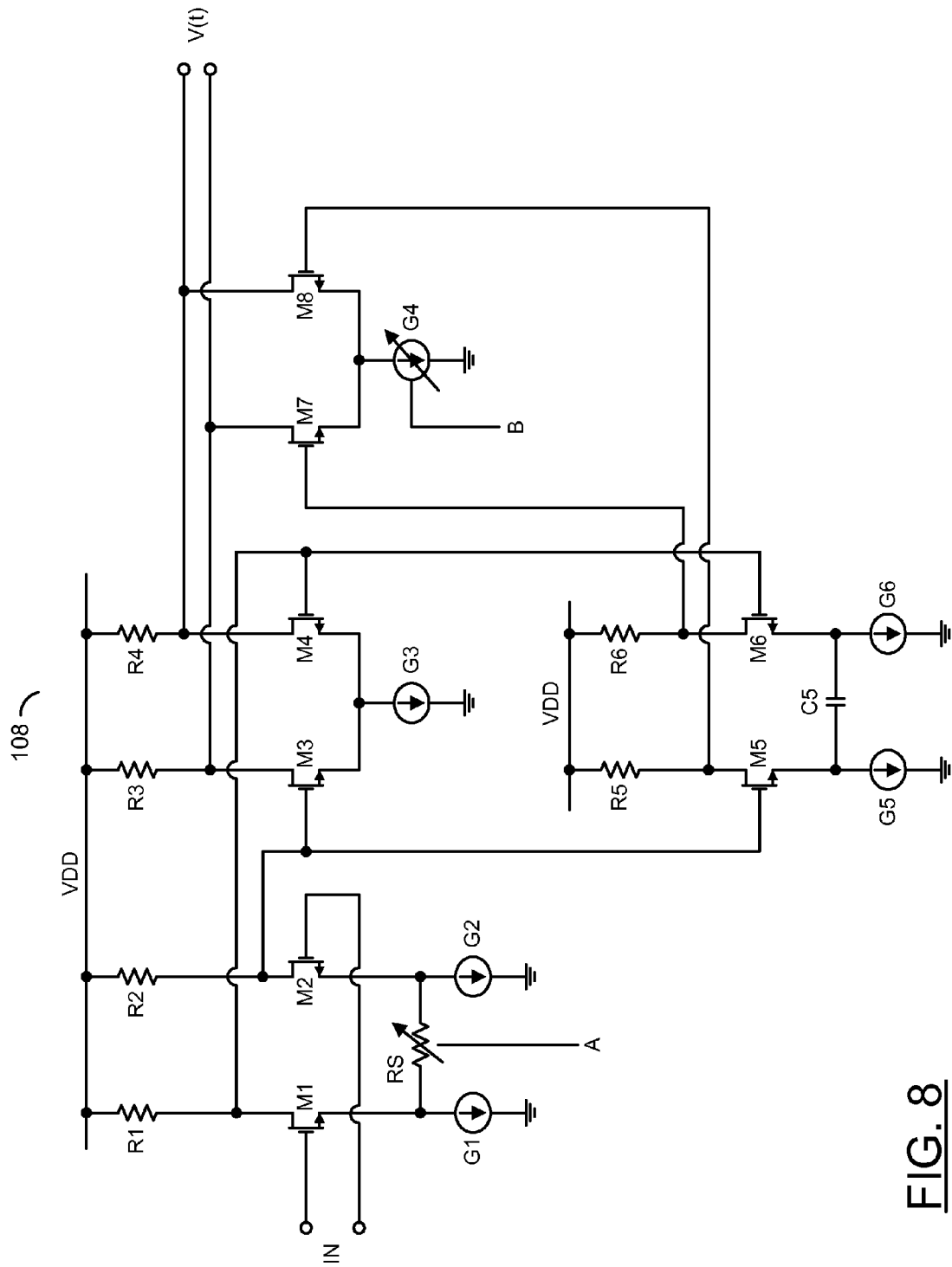
FIG. 8 is a diagram of an example implementation of the variable gain amplifier.

Referring to FIG. 8, a diagram of an example implementation of the VGA circuit 108 is shown. The circuit 108 generally comprises multiple blocks (or transistors) M1-M8, multiple blocks (or resistances) R1-R6 and RS, a block (or capacitance) C5 and multiple blocks (or current sources) G1-G6. The resistance RS may vary under the control of the signal A. The current source G4 may vary under the control of the signal B. The signal IN may be received by the transistors M1 and M2 as a differential signal. The signal V(t) may be generated from resistances R3 and R4 as a differential signal. In some embodiments, the resistances R1-R6 may be implemented as resistors. In other embodiments, the resistances R1-R6 may be implemented as transistors biased appropriately.

The transistors, the resistances, the current sources and the capacitance may be arranged as multiple (e.g., four) amplifiers (or differential amplifiers). An input amplifier generally comprises the transistors M1 and M2, the resistances R1 and R2, the current sources G1 and G2 and the variable resistance RS. The variable resistance RS may be connected between the drains of the transistors M1 and M2 to control the amplification of the circuit 108. A non-boosting amplifier generally comprises the transistors M3 and M4, the resistances R3 and R4 and the current source G3. A boosting amplifier generally comprises the transistors M5 and M6, the resistances R5 and R6, the current sources G5 and G6 and the capacitance C5 connected between the drains of the transistors M5 and M6. The capacitance C5 may act as a high pass filter resulting in a greater amplification in the high frequency boost range compared with low frequencies. A boost control amplifier generally comprises the transistors M7 and M8 and the variable current source G4. The transistors M7 and M8 may share the load resistances R3 and R4 with the transistors M3 and M4.

A differential signal generated by the input amplifier may be transferred to the gates of the transistors M3, M4, M5 and M6. A differential signal generated by the transistors M5 and M6 may be received at the gates of the transistors M7 and M8.

The differential signal created by the input amplifier may be presented in parallel to the non-boost amplifier and the boost amplifier. The non-boost amplifier generally amplifies all frequencies within a given bandwidth. The boost amplifier generally amplifies the high frequencies in the boost range greater than the lower frequencies. The boost control amplifier may vary the amount of boost in response to the signal B. The boosted signal and a non-boosted signal may be combined using the common load resistances R3 and R4 to create the signal V(t).

The circuit 108 generally provides a large flat gain over a wide bandwidth. The wide bandwidth generally accommodates at least a high percentage (e.g., 75 percent) of a baud rate of the data flowing in the channel 106. For example, at a 28 gigabits per second data rate, the bandwidth should be at least 21 GHz. The high-frequency boost generally compensates for the loss of the VGA gain at higher frequencies, consequently extending the effective bandwidth of the channel 106 and circuit 104. Although the VGA gain may not be flat as a result of the high-frequency boost, the increase (rather than attenuation) generally helps equalize the channel 106 since the channel 106 may attenuate the signal at the high frequencies.

In some embodiments, the high-frequency boost may be implemented inside a linear equalizer (e.g., the circuit 110). In a design where the linear equalizer has a programmable boost, a higher boost may be commanded when the VGA gain (e.g., of the circuit 108) is higher and a lower boost may be commanded when the VGA gain is lower to prevent over equalization. When the VGA gain is very low (which may happen when the channel 106 has low loss and so a little equalization is sufficient), the high-frequency boost may be commanded off. Since the received signal is generally strong after the low-loss channel, the VGA gain is usually very low and may even attenuate the received signal rather than amplifying the received signal. In such a case, an intrinsic linear equalization may reduce the boost to prevent over equalization.

For applications where a flat VGA gain cannot be achieved within a specified bandwidth, the VGA gain may be made higher (or boosted) at higher frequencies. The extra high-frequency boost may be used to help equalize the communication channel. To prevent over equalization, the amount of high-frequency boost should be limited. In some embodiments, the boost may be made programmable so that little or no boost may be programmed when the VGA gain is very low.

Simulations using a VGA with high-frequency boost generally show that the boost functions as a linear equalizer and improves the vertical and horizontal eye margins while utilizing a lower first DFE tap weight (e.g., H1) and a lower first TX post cursor tap weight (e.g., C1).

The functions performed by the diagrams of FIGS. 1-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, mayiletic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   an input amplifier;
   a non-boost amplifier connected to said input amplifier, said input amplifier and said non-boost amplifier configured to amplify an input signal at a first amplification according to an amplitude control signal to create a non-boosted signal, said input signal having one or more low frequency signals and one or more high frequency signals, said input amplifier and said non-boost amplifier amplifying said low frequency signals and said high frequency signals; and
   a boost amplifier connected in parallel with said non-boost amplifier, said boost amplifier configured to amplify only said one or more high frequency signals with a second amplification according to a boost control signal to create a boosted signal, said second amplification being greater than and in proportion to said first amplification, said amplitude control signal and said boost control signal being received in parallel, wherein said non-boosted signal and said boosted signal are combined to create an amplified intermediate signal.

2. The apparatus according to claim 1, wherein said first amplification is obtained using a controller configured to apply a low frequency gain, and wherein said second amplification is obtained using the controller further configured to apply a high-frequency gain, and wherein said high-frequency gain variably and continuously extends a bandwidth of said amplified intermediate signal.

3. The apparatus according to claim 2, wherein said high-frequency gain is boosted to reduce an attenuation of said input signal caused by a communication channel communicating said input signal to help equalize said input signal.

4. The apparatus according to claim 2, wherein said high-frequency gain is adjustable to reduce over-equalization.

5. The apparatus according to claim 2, wherein said high-frequency gain matches said low-frequency gain.

6. The apparatus according to claim 2, wherein said second amplification at said high-frequency gain is programmable to one of a plurality of gain codes at a time.

7. The apparatus according to claim 1, further comprising an equalizer configured to linear equalize said input signal before said first amplification.

8. The apparatus according to claim 1, further comprising a first circuit, a second circuit, and a feed forward equalizer, wherein said first circuit amplifies said input signal in a first stage amplification and said feed forward equalizer is configured to receive said input signal from said first circuit after said first stage amplification.

9. The apparatus according to claim 8, wherein said second circuit amplifies said input signal in a second stage amplification, said second circuit configured to receive said input signal from said feed forward equalizer and compensate an amplitude reduction of a main cursor in said input signal due to said feed forward equalizer.

10. The apparatus according to claim 1, further comprising a boost control amplifier, said input amplifier configured to receive and adjust said amplitude control signal, said boost control amplifier configured to receive and adjust said boost control signal, said boost control amplifier connected to said non-boost amplifier and said boost amplifier, said non-boost amplifier and said boost amplifier connected to said input amplifier, wherein said amplitude control signal is adjusted using a variable resistance and said boost control signal is adjusted using a variable current source.

11. A method for extended variable gain amplification bandwidth with high-frequency boost, comprising the steps of:
   receiving data in an input signal, said input signal received having one or more low frequency signals and one or more high frequency signals;
   amplifying said input signal with an input amplifier connected to a non-boost amplifier at a first amplification according to an amplitude control signal to create a non-boosted signal, said input signal having one or more low frequency signals and one or more high frequency signals, said input amplifier and said non-boost amplifier amplifying said one or more low frequency signals and said one or more high frequency signals;
   amplifying only said one or more high frequency signals of said input signal at a second amplification according to a boost control signal received at a boost amplifier to create a boosted signal, said boost amplifier connected in parallel with said non-boost amplifier, said boost control signal received in parallel with said amplitude control signal, said second amplification of said boost amplifier being greater than and in proportion to said first amplification; and
   combining said non-boosted signal and said boosted signal to create an amplified intermediate signal.

12. The method according to claim 11, further comprising:
   applying a low frequency gain to a first control signal from a controller for said first amplification;
   applying a high frequency gain to a second control signal from the controller for said second amplification, wherein said high-frequency gain variably and continuously extends a bandwidth of said amplified intermediate signal.

13. The method according to claim 12, wherein said high-frequency gain is adjustable to reduce over-equalization.

14. The method according to claim 12, wherein said high-frequency gain matches said low-frequency gain.

15. The method according to claim 12, further comprising the step of:
   programming said second amplification or said first amplification to one of a plurality of gain codes at a time.

16. The method according to claim 11, wherein said high-frequency gain is boosted to reduce an attenuation of said input signal caused by a communication channel communicating said input signal to help equalize said input signal.

17. The method according to claim 11, further comprising the step of:
   linear equalizing said input signal before said first amplification or after said second amplification.

18. The method according to claim 11, wherein said amplifying according to a first amplification comprises amplifying said input signal in a first stage amplification, and wherein an output of said first stage amplification is equalized using a feed forward equalizer.

19. The method according to claim 18, wherein said amplifying according to a second amplification further comprises amplifying said input signal by a second stage amplification, and wherein said second stage amplification compensates for an amplitude reduction of a main cursor in said input signal due to said feed forward equalizing.

20. An apparatus comprising:
- an input amplifier circuit connected to a non-boost amplifier circuit, said input amplifier circuit and said non-boost amplifier circuit configured to amplify a data signal having one or more low frequency signals and one or more high frequency signals at a first amplification according to an amplitude control signal to create a non-boosted data signal, said input amplifier circuit and said non-boost amplifier circuit amplifying said one or more low frequency signals and said one or more high frequency signals; and
- a boost amplifier circuit connected in parallel with said non-boost amplifier circuit, said boost amplifier circuit configured to amplify only said one or more high frequency signals with a second amplification according to a boost control signal to create a boosted data signal, said second amplification being greater than and in proportion to said first amplification, said amplitude control signal and said boost control signal being received in parallel, wherein said non-boosted data signal and said boosted data signal are combined to create an amplified intermediate data signal.

* * * * *